United States Patent [19]

Mizukami

[11] Patent Number: 5,260,906
[45] Date of Patent: Nov. 9, 1993

[54] SEMICONDUCTOR MEMORY HAVING BUILT-IN TEST CIRCUIT

[75] Inventor: Takeshi Mizukami, Tokyo, Japan

[73] Assignee: NEC Corporation, Tokyo, Japan

[21] Appl. No.: 648,795

[22] Filed: Jan. 31, 1991

[30] Foreign Application Priority Data

Jan. 31, 1990 [JP] Japan .................................. 2-23515

[51] Int. Cl.⁵ ........................ G11C 29/00; G06F 11/00
[52] U.S. Cl. .................................. 365/201; 365/200;
371/21.1; 371/71
[58] Field of Search ............... 365/189.02, 201, 200;
371/21, 71

[56] References Cited

U.S. PATENT DOCUMENTS

| | | | |
|---|---|---|---|
| 4,464,750 | 8/1984 | Tatematsu | 365/201 |
| 4,685,086 | 8/1987 | Tran | 365/201 |
| 4,873,669 | 10/1989 | Furutani et al. | 365/189.01 |
| 4,885,748 | 12/1989 | Hoffmann et al. | 365/201 |
| 4,896,322 | 1/1990 | Kraus et al. | 365/201 |

FOREIGN PATENT DOCUMENTS 0143624  6/1985  European Pat. Off. .
0206486  12/1986  European Pat. Off. .
57-105897  7/1982  Japan .

*Primary Examiner*—Eugene R. LaRoche
*Assistant Examiner*—Viet Q. Nguyen
*Attorney, Agent, or Firm*—Sughrue, Mion, Zinn, Macpeak & Seas

[57] ABSTRACT

A semiconductor memory comprises memory cell arrays and data amplifiers, four or more respectively, and two common read buses for them. Each data amplifier outputs the first and second data having respective levels complementary to each other. It further comprises the first and second logic circuits. Each logic circuit is composed of a plurality of transistors, each being located adjacent to the respective corresponding data amplifier, to the gate of each the first and second data being applied, and the drain of each being connected to the two read buses. The semiconductor memory further comprises the third logic circuit into which the data from the two read buses are input. The number of data buses needed can be reduced to only three in total for write and read operations independent of the number of memory cell arrays, contributing to minimization of chip area.

10 Claims, 6 Drawing Sheets

SEMICONDUCTOR MEMORY HAVING BUILT-IN TEST CIRCUIT

BACKGROUND OF THE INVENTION

1. Field of the Invention

This invention relates to a semiconductor memory incorporating a test circuit and more particularly to that having decision function of whether the write/read operations of data into/from memory cell arrays have been normally accomplished.

2. Description of the Prior Art

The semiconductor memory performs a decision test in the procedure of carrying out write/read operations of data in/from each memory cell of the memory cell array, and deciding, with the readout data, whether the write/read operations have been normally accomplished, or not. In the use of usual write and read circuits and nothing else for this test, increasing capacity of semiconductor memory reflects exponential prolongation of test time, making it extremely difficult to practice the test. The longer the test time, the more the cost of the semiconductor memory and the system involving it. At present, therefore, most of megabit scale semiconductor memories are provided with a test circuit-incorporating semiconductor memory for shortening test time.

A test circuit-incorporating semiconductor memory of conventional type is provided with a plurality of memory cell arrays. With the work of the built-in test circuit, a decision test is performed in the procedure of carrying out write/read operations of the same data in/from each memory cell array, and deciding whether the write/read operations have been normally accomplished, or not, according to if the readout data are identical with each other, or not.

More detailed description will be given under:

In the normal mode, on changing to the write operation, an external write data is input and written into a selected memory cell array in the memory cells. In the read operation, one of selectively readout data from each memory cell array is selected, amplified and output to the external.

The supply of write data into each memory cell array and the amplification of the data read from each memory cell array are carried out by means of the respective corresponding data amplifier.

In the test mode, on changing to the write operation, an external write data is input and written at the same time into all the memory cell arrays. In the read operation, the data read from each memory cell array is amplified by the respective corresponding data amplifier and supplied to a test circuit. The test circuit decides whether all the data supplied thereinto are identical with each other, or not. If all the data are identical, decision that the write/read operations are normal is signaled. If at least one of the data is different from the others, decision that one or both of the operations is abnormal is signaled.

After the write/read operations of the same data into/from memory cell arrays, all these data are amplified and supplied to the test circuit as stated above. For implementing the first operation memory cell arrays, are needed data amplifiers and data buses, the three kinds being correspondent to each other in one-to-one-to-one. For example, four data buses are required if the numbers of memory cell arrays and data amplifiers are four each.

On the other hand, assuming that the respective numbers of memory cell arrays, data amplifiers and data buses are fixed, the more the memory capacity is, the longer the test time is. For shortening test time, accordingly, it is necessary to increase the respective numbers of memory cell arrays, data amplifiers and data buses and to decrease memory capacity per memory cell array. For example, assuming that for 1-megabit memory capacity, the numbers of memory cell arrays, data amplifiers and data buses are four each, it follows that with increasing memory capacity as 4, 16 and 64 bits, all the respective numbers of memory cell arrays, data amplifiers and data buses required for identical test time increase as 16, 64 and 256.

The areas on a semiconductor chip that memory cell arrays and data amplifiers occupy are proportional to the memory capacity. On the other hand, the area of data buses on the semiconductor chip is proportional to only the number of them independent of memory capacity. In such-type test circuit-incorporating semiconductor memory, it is a matter of course that with increasing memory capacity, the required areas of memory cell arrays and data amplifiers increase. For shortening test time, it is needed to increase the number of data buses, accompanied by increases in the area of them, and consequently larger area of the semiconductor chip.

The output terminal of each data amplifier is connected to the corresponding data buses, respectively, thereby allowing the parasitic capacity of the wiring connecting between the data amplifier and the corresponding data bus and the parasitic capacity of the data bus itself to connect to the output terminal of each data amplifier, resulting in the delay of the output data from the data amplifier. Such parasitic capacity is the greatest on the data bus path located at the farthest from the data amplifier, and increases with larger in the number of data buses. In general, operation speed is limited by the data of the longest delay time. Increase in the number of data buses to shorten test time therefore reflects lower read operation speed.

BRIEF SUMMARY OF THE INVENTION

Objects of the Invention

It is an object of the invention to provide a test circuit-incorporating semiconductor memory permitting to minimize the area of the semiconductor chip.

Another object of the invention is to provide a test circuit-incorporating semiconductor memory permitting shortening test time without increasing the area of the semiconductor chip.

A further object of the invention is to provide a test circuit-incorporating semiconductor memory permitting higher read operation speeds.

Summary of the Invention

The test circuit-incorporating semiconductor memory according to the invention comprises a plurality of memory cell arrays and data amplifiers associated therewith, respectively. When in the selected state, each data amplifier, on changing to the write operation, supplies write data to the respective corresponding memory cell array, and in the read operation, amplifies the data read from the respective corresponding memory cell array, and outputs the first and second data having respective levels complementary to each other. When in the unselected state, the first and second data are brought to the preset level. The same write data is transmitted via a write bus to each data amplifier. The semiconductor memory further comprises first and second read buses common to the plurality of data amplifiers. It further comprises a first logic circuit including a plurality of the first transistors, to the gate of each, the first data from the corresponding data amplifier being applied, and the drain of each being connected to the common first read bus, and a second logic circuit including a plurality of second transistors, to the gate of each the second data from the corresponding data amplifier being applied, and the drain of each being connected to the common second read bus. Each of the first and second logic circuits supplies the data having the preset one of the first and second levels to the first and second read buses only when all the input data have first level. It further comprises a third logic circuit for outputting a test decision signal going to active level when one of data from the first and second read buses has the preset one of the first and second levels and the test-mode enable signal has the preset level. When the test decision signal has active level, one of data from the first and second read buses is output to a data output terminal, and when at inactive level, the data output is interrupted.

The levels of the first and second data output from the data amplifiers are preferably levels which turn OFF one of the first and second transistors and which turn ON the other.

Each of the first and second logic circuits preferably consists of a NOR circuit.

Each of the first and second logic circuits preferably consists of an AND circuit.

Each of the first and second logic circuits preferably consists of a dynamic type NOR circuit outputting a logic processing result in synchronism with a timing signal.

Each of the first and second logic circuits preferably consists of a dynamic type AND circuit outputting a logic processing result in synchronism with a timing signal.

The third logic circuit preferably consists of a NOR circuit to which data from the first and second read buses and a test-mode enable signal are input.

Each of the first and second logic circuits consists of a third transistor connected between the respective sources of the first and second transistors and a ground potential line, fourth transistor connected between the first read bus and a power supply terminal, and fifth transistor connected between the second read bus and the power supply terminal, each transistor turning ON or OFF in response to a timing signal. The first and second data from the data amplifiers are input directly to the respective gates of the first and second transistors when the first and second logic circuits are of NOR circuit, and through inverters when they are of AND circuit.

In this way, independent of memory capacity, and of the numbers of memory cell arrays and data amplifiers, only three data buses are needed for the test circuit, contributing to reduction in the area of the semiconductor chip. Shortening of test time is possible by increasing the numbers of memory cell arrays and data amplifiers for the same memory capacity similarly without needing to increase the area of the semiconductor chip. Besides such reduction in the number of data buses leads to smaller distances between data amplifiers and data buses, resulting in higher read operation speed.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Prior to description of the present invention will be described a test circuit-incorporating semiconductor memory in the prior art with reference to FIG. 1.

Figure 1:
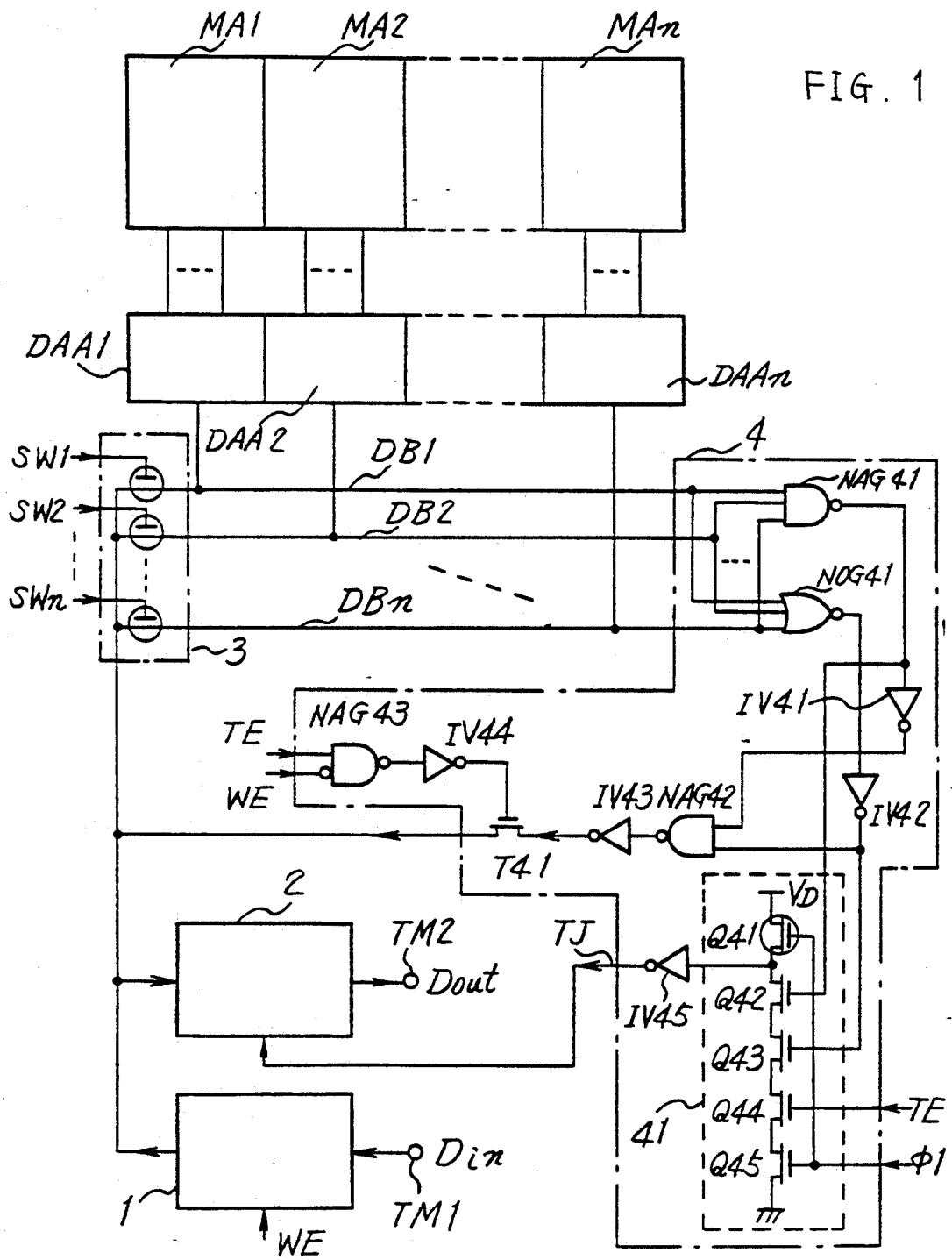
FIG. 1 is a circuit diagram of an example of test circuit-incorporating semiconductor memory in the prior art.

In the test circuit-incorporating semiconductor memory in the prior art diagrammed in FIG. 1, there are provided 'n' pieces of memory cell arrays MA1, MA2, ..., MAn; 'n' pieces of respective corresponding data amplifiers DAA1, DAA2, ..., DAAn to these memory cell arrays; and 'n' pieces of respective corresponding data buses DB1, DB2, ..., DBn to these data amplifiers. Each data bus is connected to the input/output terminal of the respective corresponding data amplifier. Besides there is provided a switch circuit 3 connected to data buses DB1 through DBn, which, in response to switch-selective signals SW1, SW2, ..., SW3, brings the data buses into selective connection to the output terminal of a data-in buffer 1 and the input terminal of a data-out buffer 2. Data buses DB1 through DBn are connected also to a test circuit 4.

Normal operation mode: In the write operation following the change of write enable signal WE to active level, the data-in buffer is activated, which allows an external write data $D_{in}$ to be supplied through a data input terminal TM1 to switch circuit 3. In response to selective signals SW1 through SWn, switch circuit 3 selects one from data buses DB1 through DBn to allow write data $D_{in}$ to be moved to the selected data bus such as DB1, and supplied via a data amplifier such as DAA1 to a memory cell array such as MA1. In the read operation, the data is read from the memory cell array such as MA1 and supplied via the reverse path to the input terminal of data-out buffer 2.

In the normal operation mode, once a test decision signal TJ changes to low active level in synchronism with a timing signal $\phi 1$, data-out buffer 2 is activated in synchronism with it, thereby the readout data from the memory cell array being output at data output terminal TM2 to the external.

Test mode: In the write operation, all the switches of switch circuit 3 turn ON, all data buses DB1 through DBn are connected to the output terminal of data-in buffer 1, one and the same write data $D_{in}$ is written into each memory cell array MA1 through MAn. As to the read operation, data buses DB1 through DBn are disconnected from the output terminal of data-in buffer 1 and the input terminal of data-out buffer 2, the readout data from each of memory cell arrays MAA1 through MAAn are input into test circuit 4 through data amplifiers DAA1 through DAAn and data buses DB1 through DBn. If all these thus-input data are identical, the output data from a NAND gate 'NAG41' and NOR gate 'NOG41' should be identical with each other, and in this case a decision that the write/read operation has been correctly accomplished is signaled.

This decision is attained by means of a decision circuit 41 which comprises a p-channel MOS transistor Q41 and four n-channel MOS transistors Q42, A43, Q44 and Q45 connected in series between a power supply $V_D$ and a ground potential line. The respective gates of one p-channel transistor Q41 and one n-channel transistor Q45 receives timing signal $\phi 1$, and the respective gates of the other three n-channel transistors Q44, Q43, an Q42 receives test-mode enable signal 'TE', the output of the NOR gate 'NOG41' through inverter 'IV42', and the output of the NAND gate 'NAG41'. Timing signal $\phi 1$ which, when it goes to low level, causes transistor Q41 to turn ON and so periodically precharges at the output terminal of decision circuit 41 to high level. In the normal operation mode, test-mode enable signal TE is held low level, and whereby transistor Q44 is always kept in OFF state, the output of decision circuit 41 is held disconnected from the ground, and in turn test decision signal TJ which is the output of an inverter IV45 of the decision circuit 41 is kept at low active level. Test-mode enable signal TE is caused to move to high level, and thus in the test mode, transistor Q44 turns ON. Then in synchronism with high levels of timing signals $\phi 1$, transistor Q45 turns periodically ON, thus decision outputs being signaled.

If the readout data from the memory cells are identical with each other, the output data of NAND gate 'NAG41' and NOR gate 'NOG41' in test circuit 4 are always identical. As the result, always different data are applied to the gates of transistors Q42 and Q43, respectively, and inevitably either of these transistors turns OFF. Thus the output terminal of decision circuit 41 is held at high level precharged, and consequently test decision signal TJ becomes low active level, thereby activating data-out buffer 2. Simultaneously with this, data having the same level as data of data buses DB1 through DBn is transmitted through IV41, IV42, a NAND gate 'NAG42', an inverter IV43, and transfer gate T41 to the input terminal of data-out buffer 2. If normal write/read operations have been accomplished as mentioned above, data having the correspondent level to that of the external write data $D_{in}$ is output at data output terminal TM2 to the external.

On the other hand, if at least one of readout data from the memory cells is different from the others, always the output of NAND gate 'NAG41' in test circuit 4 goes to high level and the output of NOR gate 'NOG41' goes to low level, and in turn, both transistors Q42, Q43 of decision circuit 41 turn ON, changing to low level at the output terminal. Thus a decision signal TJ changes to high level, which inactivates data-out buffer 2, resulting in high-impedance state of data output terminal TM2. This indicates that error has arose.

As described above, test of a semiconductor memory has been performed in the procedure comprising writing simultaneously the same data in each memory cell array MA1 through MAn, then reading these data from them, and deciding whether the readout data are identical with each other, or not.

In this conventional test circuit-incorporating semiconductor memory, data amplifiers DAA1 through DAAn are always in operational state, and hence it is necessary to control selectively transmission of data from data-in buffer 1 to data amplifiers DAA1 through DAAn, and from these data amplifiers to data-out buffer 2, and to transmit data from each data amplifier DAA1 through DAAn to test circuit 4. Thus the same number of data buses DB1 through DBn as that of data amplifiers DAA1 through DAAn is required. Larger memory capacity reflects increase in the number of data buses DB1 through DBn for shortening test time, and in turn larger area of semiconductor chip, leading to larger capacity of wiring connected to data amplifiers DAA1 through DAAn, and lower read operation speed.

Figure 2:
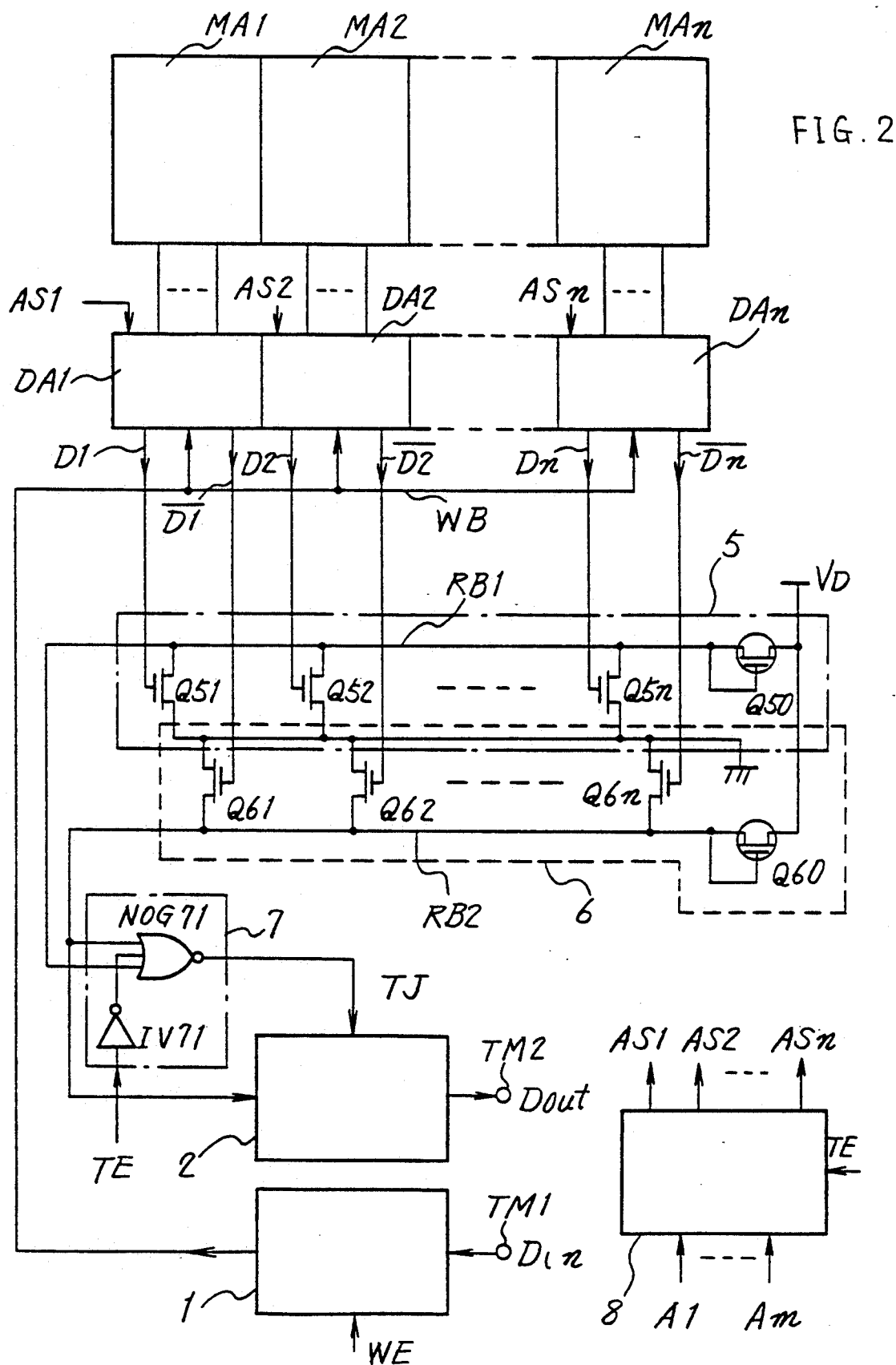
FIG. 2 is a circuit diagram of a (the first) test circuit-incorporating semiconductor memory embodying the present invention.

An embodiment of the present invention will be described with reference to the accompanying drawings hereinafter:

Referring to FIG. 2, the test circuit-incorporating semiconductor memory of the first embodiment of the present invention comprises 'n' pieces of memory cell arrays MA1 through MAn and 'n' pieces of data amplifiers, DA1, DA2, . . . , DAn each adjacent and connected via a number of input/output buses to the respective memory cell arrays MA1 through MAn. When in state selected in response to the respective corresponding selective signal AS1, AS2, . . . , ASn, each data amplifier DA1 through DAn, in the write operation, supplies write data from write bus WB to the respective corresponding memory cell array MA1 through MAn, and in the read operation, amplifies readout data from the respective corresponding memory cell array MA1 through MAn and outputs the first and the second data having respective complementary values (D1, $\overline{D2}$,) (D2, $\overline{D2}$), . . . , (Dn, Dn). When in unselected state, each amplifier causes the first and second data (D1, $\overline{D1}$) through (Dn, $\overline{Dn}$) to change to low level. Write bus WB runs parallel to the disposed data amplifiers DA1 through DAn, and is connected between the input terminal of each data amplifiers DA1 through DAn and the output terminal of data-in buffer 1. Once write enable signal WE changes to active level, data-in buffer 1 is activated to allow write data $D_{in}$ to be input via data input terminal TM1 and appear on write bus WB. There are provided the first and second read buses RB1 and RB2 running parallel to the disposed data amplifiers DA1 through DAn. The first read bus RB1 is connected commonly to the drains of first transistors Q51, Q52, . . . , Q5n adjacent and correspondent to data amplifiers DA1 through DAn, respectively. The first data D1, D2, . . . , Dn from data amplifiers DA1 through DAn are applied to the gates of the corresponding first transistors Q51, Q52, . . . , Q5n, respectively. Besides the sources of these transistors are connected altogether to a ground potential line. The second readout bus RB2 is connected commonly to the drains of second transistors Q61, Q62, . . . , Q6n adjacent and correspondent to data amplifiers DA1 through DAn, respectively. The second data $\overline{D1}, \overline{D2}, \ldots, \overline{Dn}$ from data amplifiers DA1 through DAn are applied to the gates of the corresponding second transistors Q61, Q62, ..., Q6n, respectively. Besides the sources of these transistors are connected altogether to a ground potential line. The first and second read buses RB1, RB2 are to connected a power supply terminal $V_D$ through transistors Q50, Q60 as resistor elements, respectively. The first transistors Q51 through Q5n and transistor Q50 constitutes the first logic circuit 5, and on the other hand, the second transistors Q61 through Q6n and transistor Q60 do the second logic circuit 6. The first and second logic circuits 5, 6 each operate as a NOR circuit and the respective outputs therefrom are supplied to the first and second read buses RB1, RB2.

The first and second read buses are also connected to the two inputs of a three-input NOR gate 'NOG71'. Test-mode enable signal TE is inverted through an inverter IV71 and applied to the remaining input of NOR gate 'NOG71'. The third logic circuit 7 which is composed of NOR gate 'NOG71' and inverter 'IV71' outputs a test decision signal TJ having low active level. In response to this test signal TJ when at low active level, Data-out buffer 2 supplies data appearing on the second read bus RB2 to data output terminal TM2. A data amplifier-selective circuit 8 causes all data amplifiers DA1 through DAn to be in selective state in response to test-mode enable signal TE when at active level, that is, in the test mode, and on the other hand, when test-mode enable signal TE has inactive level, that is, in the normal operation mode, causes one of data amplifiers DA1 through DAn to become selected state in response to memory cell array-selective signals A1 through An.

Figure 3:
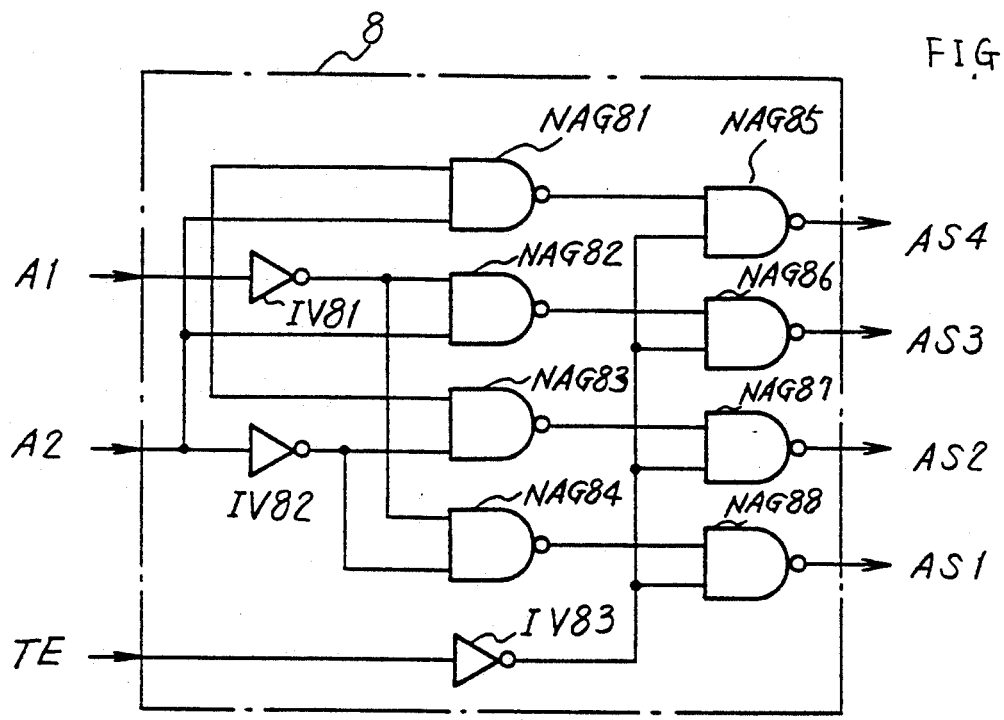
FIG. 3 is a detailed circuit diagram of an example of data amplifier-selective circuit for use in the embodiment of FIG. 2.

FIG. 3 diagrams an example of data amplifier-selective circuit 8, on the assumption that the number (n) of data amplifiers is 4, comprising an inverter IV83 receiving test-mode enable signal TE, and four NAND gates; 'NAG85', 'NAG86', 'NAG87' and 'NAG88' each having two inputs. One input of each gate commonly receives the output of inverter IV83 and the other is connected to respective output of the four-output logic circuit which comprises inverters IV81, IV82 and NAND gates 'NAG81' to 'NAG84' and which receives memory cell array-selective signals A1, A2. In response to states these input signals, one output of the 4-output logic circuit goes to low level and the remaining three goes to high level. On switching to the test mode, test-mode enable signal TE goes to high level, causing one of the two inputs of every NAND gate 'NAG85' to 'NAG88' to change to low level, consequently all the respective outputs: selective signals AS4, AS3, AS2 and AS1 to high level. In normal mode, test-mode enable signal TE has low level, and consequently only one of selective signals AS1 through AS4 is brought to high level in response to the state of memory cell array-selective signals A1, A2.

Figure 4:
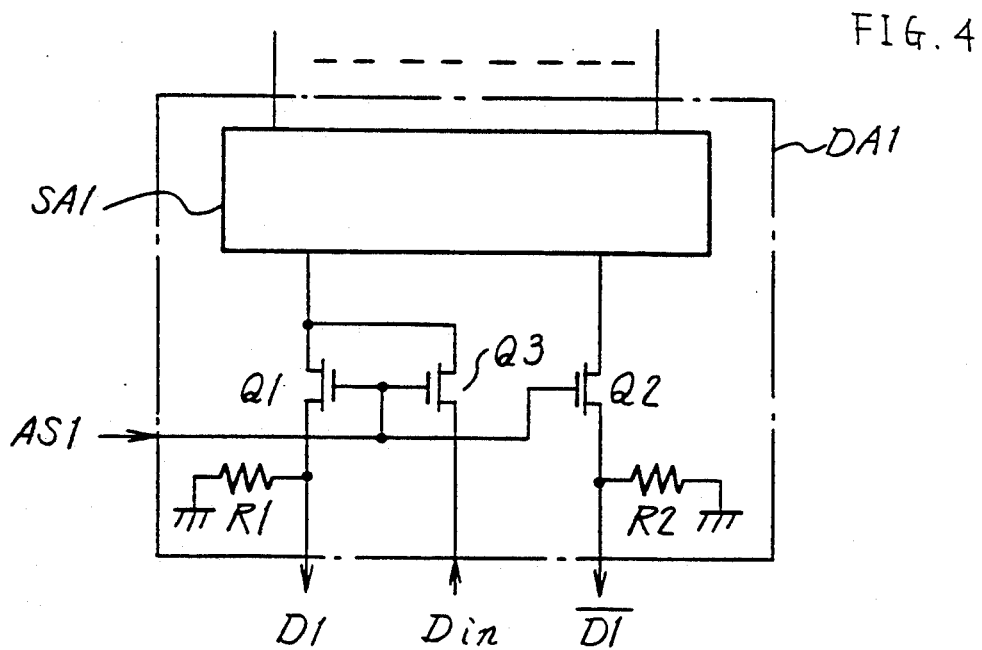
FIG. 4 is a detailed circuit diagram of the input/output section of a data amplifier in the embodiment of FIG. 2.

Referring to FIG. 4, the input/output circuit section of data amplifier DA1 comprises n-channel MOS transistors Q1, Q2 serving as transfer gates, each being connected between a pair of input/output terminals of a known amplifier section SA1 and the first and second data lines D1, $\overline{D1}$, respectively; a n-channel MOS transistor Q3 serving as a transfer gate connected between one input/output terminal of amplifier section SA1 and write bus WB, and pull-down resistors R1, R2 connected between first and second data lines D1, $\overline{D1}$ and a ground potential line. The other amplifiers DA2 to DAn have similar configuration.

Implement three transistors Q1, Q2, Q3 receive selective signal AS1 commonly at the respective gates, and hence, when it goes to high level, connect from the amplifier section SA1 to the first and second data lines D1, D1 and to write bus WB, thus to transmit the level of input data $D_{in}$ to amplifier section SA1, and to transmit the output level of amplifier section to data lines D1, $\overline{D1}$. When selective signal AS1 has low level, the input-/output terminal of amplifier section SA1 is disconnected from write bus WB and data lines D1, $\overline{D1}$, and consequently data lines D1, $\overline{D1}$ are set to low level by pull-down resistors R1, R2.

In this following, the function of this embodiment will be detailed:

Normal operation mode: In the write operation following the change of write enable signal WE to active level, data-in buffer 1 becomes activated to transmit write data $D_{in}$ from data input terminal TM1 to write bus WB. Then the write data is supplied through a selected data amplifier (such as DA1) which has become selected by the action of data amplifier-selective circuit 8 to the corresponding memory array (such as MA1), and thus written in a specified address.

In the read operation, the readout data from memory cell arrays MA1 through MAn are supplied to the respective corresponding data amplifiers DA1 through DAn, one (such as DA1) of which has become selected by the action of data amplifier-selective circuit 8. This selected data amplifier (DA1) amplifies the readout data from the corresponding memory cell array (MA1), and outputs the first and second data (D1, $\overline{D1}$) having respective levels complementary to each other. When the first data (D1) has high level, transistor Q51 of logic circuit 5 turns ON, thereby bringing read bus RB1 to low level. The respective first and second data (D2, $\overline{D2}$) through (Dn, Dn) of unselected data amplifiers (DA2 to DAn) have low level, and hence transistors Q52 to Q5n are in OFF state, thus the level of the output of logic circuit 5 being unaffected by them. With respect to logic circuit 6, transistor Q61 turns OFF, and other transistors Q62 to Q6n are in OFF state, too. Thus read bus RB2 goes to high level. On the other hand, test-mode enable signal TE has low level, inevitably causing the output of NOR gate 'NOG71' of logic circuit 7, that is, test decision signal TJ, to goes to low active level, with the result that data-out buffer 2 outputs the high level data from read bus RB2 to data output terminal TM2.

Test mode: In the write operation following the change of write enable signal WE to active level, data-in buffer 1 becomes activated and thereby write data $D_{in}$ is input through data input terminal TM1 and supplied through write bus WB to each data amplifier DA1 through DAn, all of which having become selected in response to high level test-mode enable signal TE by the action of data amplifier-selective circuit 8 as described earlier. Thus the same data is written into all the memory cell arrays MA1 through MAn.

In the read operation, readout data from each memory cell array MA1 through MAn is supplied to the respective corresponding data amplifier DA1 through DAn, everyone of which having become selected by the action of data amplifier-selective circuit 8. Thus each data amplifier DA1 through DAn amplifies the readout data from the respective corresponding memory cell array MA1 through MAn, and outputs the first and second data (D1, $\overline{D1}$) through (Dn, $\overline{Dn}$) having the respective complementary levels complementary to one another. When all the first data D1 through Dn have high level, all transistors Q51 through Q5n of logic circuit 5 turn ON, and consequently read bus RB1 is moved to low level. On the other hand, all the second data D1 through Dn have low level, causing all transistors Q61 through Q6n of logic circuit 6 to turn OFF, and consequently read bus RB2 to go to high level. As stated above, if both write and read operations have been normally accomplished, high level appears on one of read buses RB1, RB2 and low level on the other. If at least one data of incorrect level attributable to abnormal write and/or read operations is present, that is, at least one of the first and second data (D1, $\overline{D1}$) through (Dn, $\overline{Dn}$) is of high level, and the other are of low level, then at least one of transistors Q51 through Q5n and at least one of transistors Q61 through Q6n inevitably turn ON, and read buses RB1, RB2 change to low level. As the result, test decision signal TJ, which is the output of NOR gate 'NOG71' to which data on read buses RB1, RB2 are input becomes low active level, if write/read operations have been normally accomplished, and high inactive level if not so. Thus decision whether write-/read operations are normal, or not, can be signaled. When the test decision signal TJ has active level, it activates data-out buffer 2, and thereby data from read bus RB1 having the same level as the first data D1 of data amplifier DA1 has is output at data output terminal TM2 to the external. The test decision signal TJ having inactive level inactivates data-out buffer 2 of which the output terminal TM2 consequently becomes high impedance state, this permitting the sense of 'abnormal' from the external.

The advantages of this embodiment are as follows:

First, independent of memory capacity, the number of memory cell arrays MA1 through MAn, and so on, the number of data buses running parallel to the memory cell arrays MA1 through MAn and the disposed data amplifiers DA1 through DAn can be set to three pieces of write bus WB and the first and second read buses RB1 and RB2. This enables smaller area for the data bus wiring, and in turn smaller area for the semiconductor chip. On the assumption of a fixed test time, as compared with the conventional example needing 16, 64 and 256 data buses for 4, 16 and 64 bits memory capacities, respectively, this embodiment requires only 3 data buses for any of the three memory capacities, and therefore is more advantageous with increasing memory capacity.

Second, for the same memory capacity, increase in the numbers of memory cell arrays MA1 through MAn and data amplifiers DA1 through DAn affects little the area these take. In addition, the number of data buses is fixed to three as above-mentioned, and therefore the number of data simultaneously written and/or read can be increased without increasing the area of the semiconductor chip, which can contributes to shorter test time.

In the following, comparison in read operation speed to the conventional example will be given.

Normal operation mode: the largest-capacity path between data amplifiers DA1 through DAn and data-out buffer 2, neglecting transistors on path, involves the way from data amplifiers DA1 through DAn to read bus RB2 in this embodiment, and the way from data amplifiers DAAn to data bus DBn in the conventional example. By comparison between these paths, in this embodiment, the number of data buses is smaller, leading to shorter distance between data amplifiers and data buses. The resultant smaller parasitic capacity of the wiring path, from the viewpoint of only this, contributes to higher read operation speed. Transistors in switch circuit 3 in the prior art are involved merely in transmission of data, whereas in this embodiment, transistors Q61 through Q6n on the path have function of amplification as well, which also contributes to higher operation speed.

Test mode: In this embodiment the data-read path having the largest capacity involves the way from data amplifiers DA1 through DAn to read bus RB2. On the other hand, in the prior art, it involves the way from data amplifier DAAn via data bus DBn, NAND gate 'NAG41', inverter IV41, NAND gate 'NAG42' and inverter IV3 to transfer gate T41. The wire length from transfer gate T41 to data-out buffer 2 is substantially equal as to data bus DB1, resulting in larger parasitic capacity. Besides the number of data buses is larger, and accordingly the distance between data amplifier DAAn and data bus DBn and larger parasitic capacity is larger. Seeing that comparison between the paths of test decision signal TJ is much the same as described above, and in addition taking transistors on the paths into consideration, read operation speed can be by far higher in this embodiment.

Figure 5:
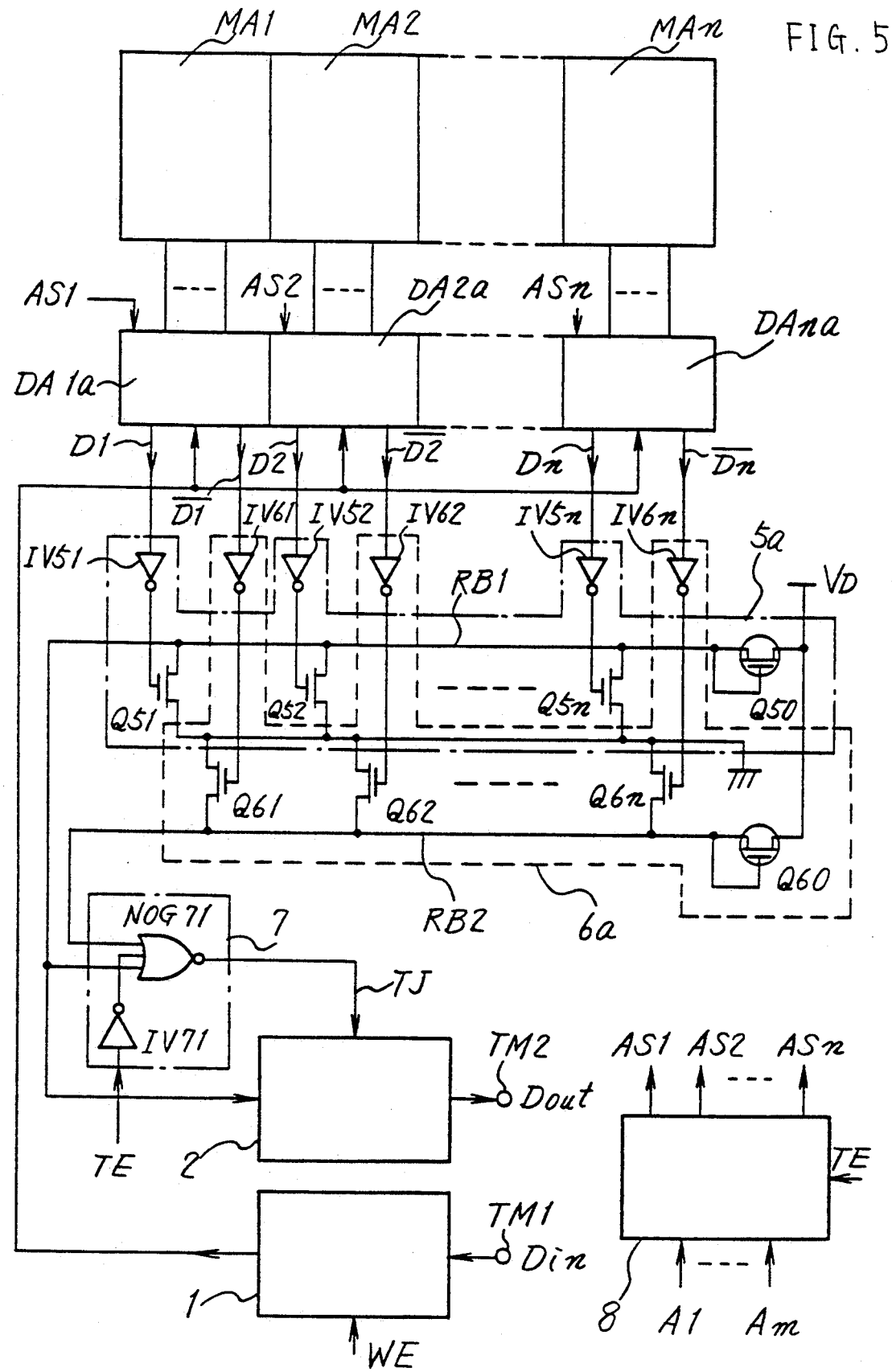
FIG. 5 is a circuit diagram of an alternative (the second) test circuit-incorporating semiconductor memory embodying the present invention.

FIG. 5 is a circuit diagram of the second embodiment of the present invention, which is distinguished from the first embodiment diagrammed in FIG. 2 in the respect that inverters IV51 through IV5n are inserted in gate wires of transistors Q51 through Q5n, respectively, and IV61 through IV6n are done in gate wires of transistors Q61 through Q6n, respectively, to convert the first and second logic circuit into AND circuits. Thus when in unselected state, data amplifiers DA1a to DAna output the first and second data D1, $\overline{D1}$ through Dn, $\overline{Dn}$ having high level, which are supplied through read bus RB1 to data-out buffer 2. The remaining in configuration is the same as the first embodiment and hence not described.

Compared with the first embodiment, the second embodiment has additional effect that in virture of reduced loads of data amplifiers DA1a to DAna resulting from the further provision of inverters IV51 through IV5n and IV61 through IV6n, the operation speed of data amplifiers DA1a to DAna becomes higher.

Figure 6:
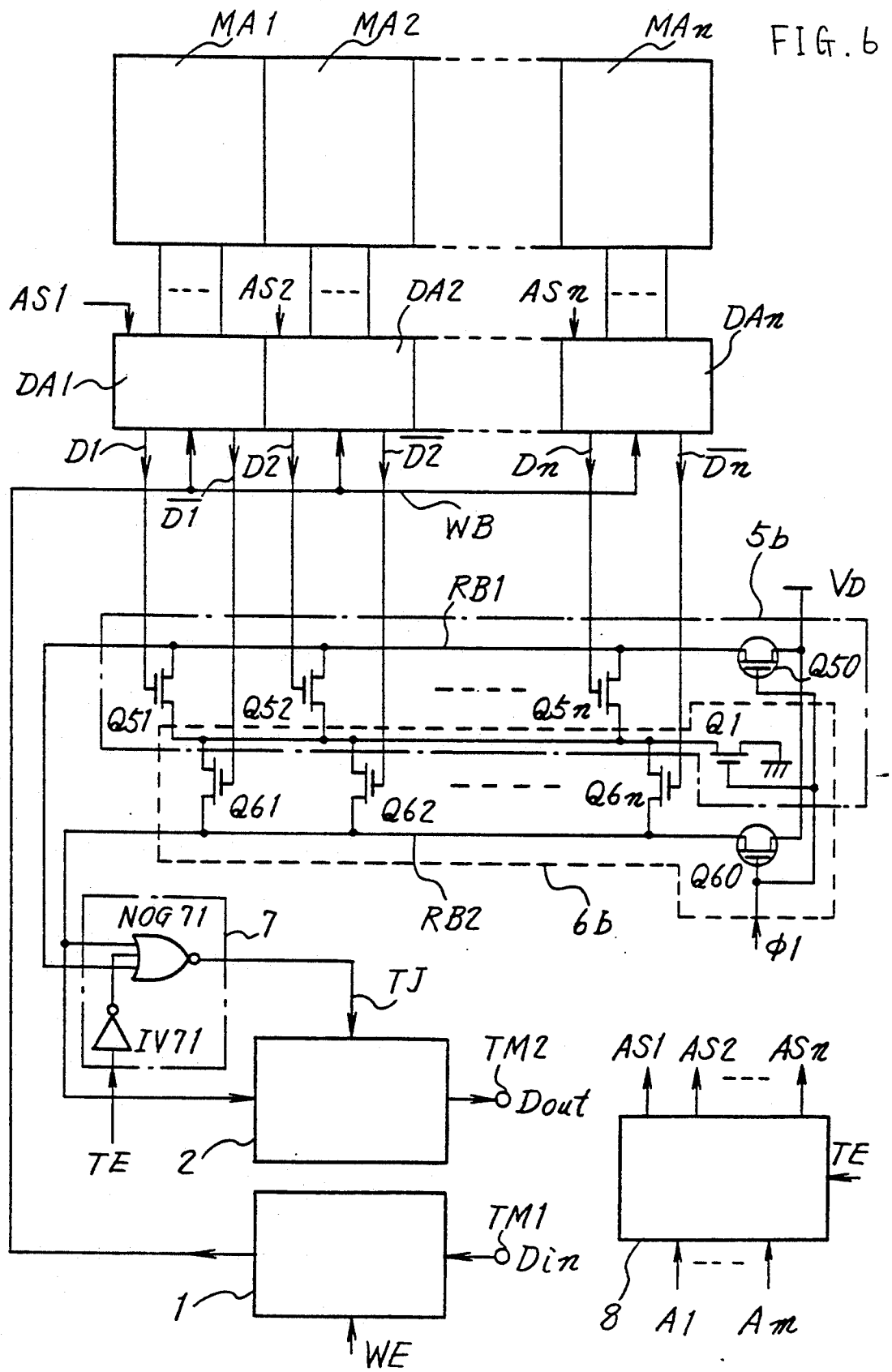
FIG. 6 is a circuit diagram of another alternative (the third) test circuit-incorporating semiconductor memory embodying the present invention.

FIG. 6 is a circuit diagram of the third embodiment of the present invention which comprises, instead of the first and second logic circuits 5, 6 in the first embodiments, the first and second dynamic-type logic circuits 5b, 6b outputting the logic-processing results in synchronism with timing signal $\phi1$ are provided. Logic circuits 5b, 6b of the third embodiment is distinguished from logic circuits 5, 6 in the respect that timing signal $\phi1$ is applied to the gates of p-channel MOS transistors Q50, Q60, and a n-channel MOS transistor Q1, the gate of which receives timing signal $\phi1$, is inserted between the common source of transistors Q51 through Q5n and Q61 through Q6n and a ground potential line.

In the logic circuits 5a, 6b in response to low level of timing signal $\phi1$, transistor Q1 turns OFF, transistors Q50, Q60 turn ON, and read buses RB1, RB2 are precharged. On the other hand, in response to high to level of timing signal $\phi1$, transistor Q1 turns ON, transistors Q50, Q60 turn OFF, and levels of read buses RB1, RB2 depend on whether transistors Q51 through Q5n and Q61 through Q6n turn ON of OFF, respectively.

In the first and second embodiments described above, when at least one of transistors Q51 through Q5n, Q61 through Q6n is in ON state, electric current is always supplied from the power supply terminal $V_D$. On the other hand, the third embodiment, in which when timing signal $\phi 1$ has low level, only electric current for charging read buses RB1, RB2 is found, hence is of low power consumption type.

Figure 7:
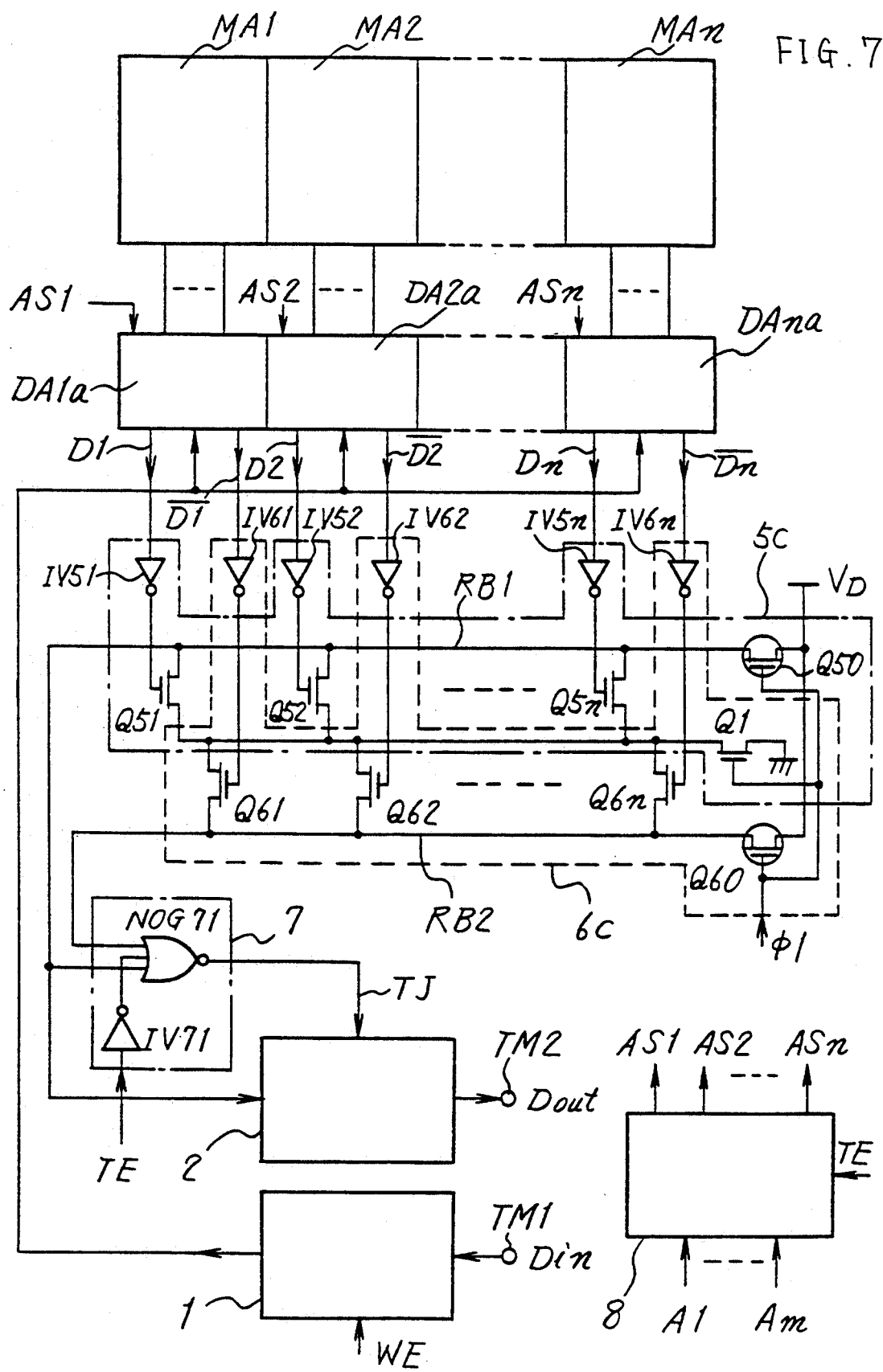
FIG. 7 is a circuit diagram of further alternative (the fourth) test circuit-incorporating semiconductor memory embodying the present invention.

FIG. 7 is a circuit diagram of the fourth embodiment of the present invention which comprises, in the place of the first and second logic circuits 5a, 6a of the second embodiment, the first and second logic circuits 5c, 6c of the dynamic type which output logic processing result in synchronism with timing signal $\phi 1$. This modification is the same as in the third embodiment.

The fourth embodiment not only has similar advantage but also is of low power consumption type.

Instead of using NOR circuit and AND circuit of dynamic or non-dynamic type as the first and second logic circuits, and NOR circuit as the third logic circuit in those embodiments, these logic circuits can be realized as with exclusive OR circuit and common equivalence detection circuit.

Although the invention has been described with reference to specific embodiments, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor memory comprising:
a plurality of memory cell arrays;
a plurality of data amplifiers provided for said memory cell arrays, respectively, one of said data amplifiers being activated during a normal write operation to supply write data to a corresponding one of said memory cell arrays, all of said data amplifiers being activated during a test write operation to supply test write data to all of said memory cell arrays, one of said data amplifiers being activated during a normal read operation to output data derived from a corresponding one of said memory cell arrays, all of said data amplifiers being activated during a test read operation to output data derived from all of said memory cell arrays;
said data amplifiers having first output terminals for supplying first output data and second output terminals for supplying second output data, said second output data having a logic value opposite to a logic value of said first output data;
a write bus connected in common to said data amplifiers to transmit said write data and said test write data;
first and second read buses;
a first logic circuit coupled to said first output terminals of said data amplifiers and to said first read bus for supplying said first read bus with a first logic level when any one of said first output data supplied from said first output terminals is in a first logic state and with a second logic level when all of said first output data supplied from said first output terminals is in a second logic state;
a second logic circuit coupled to said second output terminals of said data amplifiers and to said second read bus for supplying said second read bus with said first logic level when any one of said second output data supplied by said second output terminals is in said first logic state and with said second logic level when said second output data from all of said second output terminals is in said second logic state;
a data input circuit coupled to said write bus for supplying said write bus with said write data in said normal write operation and with said test write data in said test write operation;
a data output circuit coupled to said first read bus and supplied with an output-enable signal, said data output circuit producing output data representative of a logic level on said first read bus when said output-enable signal is at an active level and for preventing output of said output data when said output-enable signal is at an inactive level; and
a third logic circuit coupled to said first read bus and said second read bus for generating said output-enable signal, said inactive level of said output-enable signal being generated when both said first read bus and said second read bus are at said first logic level in said test read operation, said active level being generated when at least one of said first read bus and said second read bus is at said second logic level in said test read operation.

2. A semiconductor memory as defined in claim 1, wherein said first logic circuit includes a plurality of first transistors having gates connected respectively to said first output terminals of said data amplifiers and drains connected in common to said first read bus; and said second logic circuit includes a plurality of second transistors having gates connected respectively to said second output terminals of said data amplifiers and drains connected in common to said second read bus.

3. A semiconductor memory as defined in claim 2, wherein said first and said second output terminals of said data amplifiers respectively supply logic level values which turn off said plurality of first transistors and said plurality of said second transistors when said data amplifiers are not activated.

4. A semiconductor memory as defined in claim 1, wherein each of said first and second logic circuits consists of a NOR circuit.

5. A semiconductor memory as defined in claim 1, wherein each of said first and second logic circuits consists of an AND circuit.

6. A semiconductor memory as defined in claim 1, wherein each of said first and second logic circuits consists of a dynamic type NOR circuit outputting logic processing result in synchronism with a timing signal.

7. A semiconductor memory as defined in claim 1, wherein each of said first and second logic circuits consists of a dynamic type AND circuit outputting logic processing result in synchronism with a timing signal.

8. A semiconductor memory as defined in claim 1, wherein said third logic circuit consists of a NOR circuit to which the data from the first and second read buses and a test-mode enable signal are input.

9. A semiconductor memory as defined in claim 1, wherein said first logic circuit includes a plurality of first transistors of a first conductivity type having gates connected respectively to said first output terminals of said data amplifiers, drains connected to common to said first read bus and sources connected in common to a drain of a second transistor of said first conductivity type having a source connected to a first power line, a drain connected to said sources of said plurality of first transistors and a gate supplied with a timing signal, and a third transistor of an opposite conductivity type having a source connected to a second power line, a drain connected to said first read bus and a gate supplied with said timing signal;

said second logic circuit including a plurality of fourth transistors of said first conductivity type having gates connected respectively to said second output terminals of said data amplifiers, drains connected in common to said second read bus and sources connected in common to said drain of said second transistor of said first logic circuit, and a fifth transistor of said opposite conductivity type having a source connected to said second power line, a drain connected to said second read bus and a gate supplied with said timing signal.

10. A semiconductor memory as defined in claim 1, wherein, said first logic circuit includes a plurality of first inverters having input terminals connected respectively to said first output terminals of said data amplifiers, a plurality of first transistors of a first conductivity type having gates connected respectively to output terminals of said plurality of inverters, drains connected in common to said first read bus and sources connected in common to a drain of a second transistor of said first conductivity type having a source connected to a first power line, a drain connected to said sources of said plurality of first transistors and a gate supplied with a timing signal, and a third transistor of an opposite conductivity type having a source connected to a second power line, a drain connected to said first read bus and a gate supplied with said timing signal;

said second logic circuit including a plurality of second inverters having input terminals connected respectively to said second output terminals of said data amplifiers, a plurality of fourth transistors of said first conductivity type having gates connected respectively to output terminals of said second inverters, drains connected in common to said second read bus and sources connected in common to said drain of said second transistor of said first logic circuit, and a fifth transistor of said opposite conductivity type having a source connected to said second power line, a drain connected to said second read bus and a gate supplied with said timing signal.

* * * * *